(12) United States Patent
Bol

(10) Patent No.: US 7,944,035 B2
(45) Date of Patent: May 17, 2011

(54) DOUBLE SIDED SEMICONDUCTION DEVICE WITH EDGE CONTACT AND PACKAGE THEREFOR

(75) Inventor: Igor Bol, Sherman Oaks, CA (US)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 11/803,763

(22) Filed: May 16, 2007

(65) Prior Publication Data
US 2007/0273016 A1 Nov. 29, 2007

Related U.S. Application Data

(60) Provisional application No. 60/802,390, filed on May 22, 2006.

(51) Int. Cl.
*H01L 23/02* (2006.01)

(52) U.S. Cl. ......... 257/686; 257/E23.085; 257/E23.063; 257/E23.071; 257/E29.013; 257/E29.027; 257/E29.271; 257/723; 257/777; 257/328; 257/329; 257/335; 257/336; 257/489; 257/492; 257/341; 257/288; 257/339; 257/408; 257/139; 257/342; 257/345; 257/378; 257/401; 257/476; 257/486

(58) Field of Classification Search ........... 257/E29.013, 257/E29.027, E29.04, E29.66, E21.418, E29.257, 257/E29.066, 328, 329, 335, 336, 489, 492, 341, 288, 339, 408, 139, 342, 345, 378, 401, E29.271, 476, 486
See application file for complete search history.

(56) References Cited

U.S. PATENT DOCUMENTS

| 5,144,401 | A | * | 9/1992 | Ogura et al. | 257/138 |
|---|---|---|---|---|---|
| 5,426,314 | A | * | 6/1995 | Nishizawa et al. | 257/136 |
| 5,963,064 | A | * | 10/1999 | Toyota et al. | 327/103 |
| 6,054,737 | A | * | 4/2000 | Magri' et al. | 257/341 |
| 6,208,084 | B1 | * | 3/2001 | Urakabe et al. | 315/169.4 |
| 6,228,719 | B1 | * | 5/2001 | Frisina et al. | 438/268 |
| 6,429,492 | B1 | * | 8/2002 | Rockett | 257/368 |
| 6,476,443 | B1 | * | 11/2002 | Kinzer | 257/329 |
| 6,548,864 | B2 | * | 4/2003 | Magri' et al. | 257/341 |
| 6,586,798 | B1 | * | 7/2003 | Frisina | 257/328 |
| 6,627,961 | B1 | * | 9/2003 | Francis et al. | 257/378 |
| 6,671,146 | B1 | * | 12/2003 | Hashimoto et al. | 361/56 |
| 2004/0079193 | A1 | * | 4/2004 | Kokubo et al. | 75/252 |
| 2009/0008758 | A1 | * | 1/2009 | Lu et al. | 257/676 |

* cited by examiner

*Primary Examiner* — Alexander O Williams
(74) *Attorney, Agent, or Firm* — Farjami & Farjami LLP

(57) ABSTRACT

A semiconductor die has devices such as MOSgated devices, diodes and the like formed into the top and bottom surfaces of the die. One terminal of each of the devices terminal in the interior center of the die and a common contact is made to the interior center of the die at one edge of the die. Various packages for the die having a reduced foot print on a support substrate are disclosed.

18 Claims, 7 Drawing Sheets

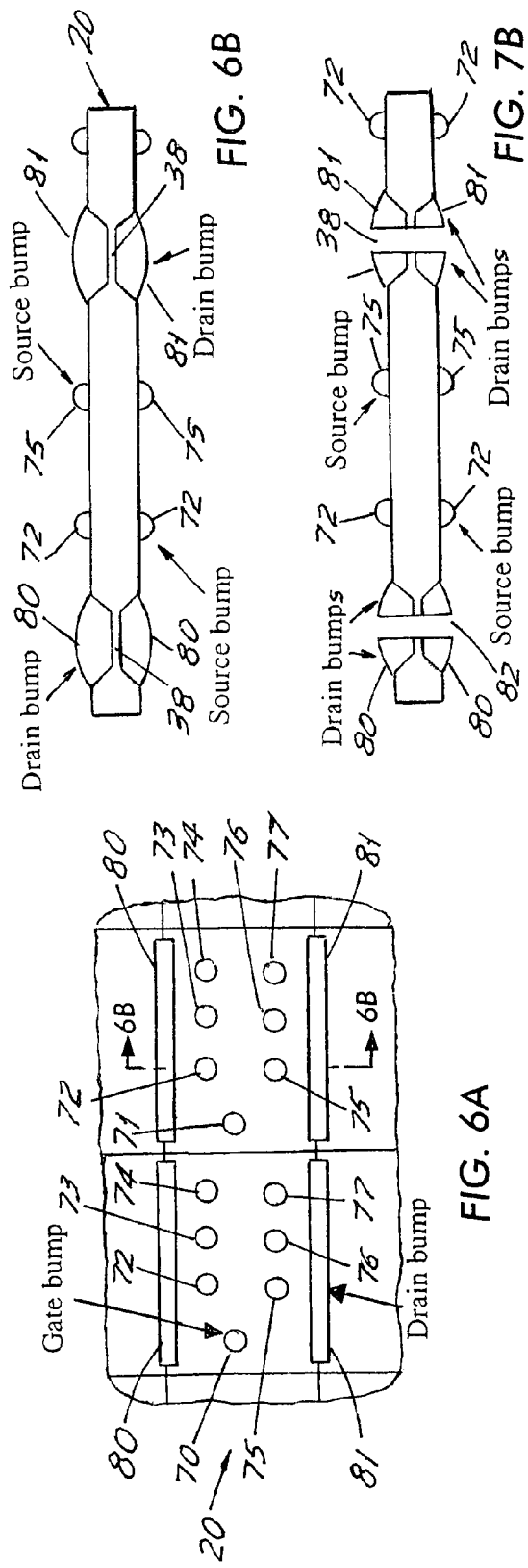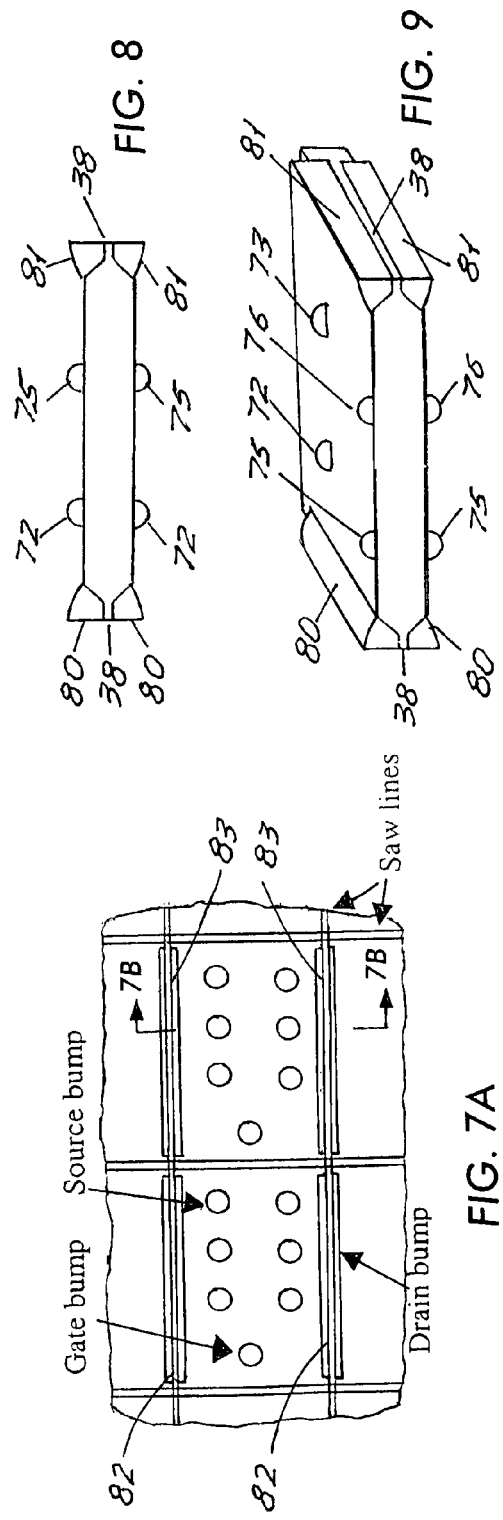

Double-sided Substrate blade

Double-sided Substrate blade

DOUBLE SIDED SEMICONDUCTION DEVICE WITH EDGE CONTACT AND PACKAGE THEREFOR

RELATED APPLICATIONS

This application claims the benefit of U.S. Provisional Application No. 60/802,390, filed May 22, 2006, the entire disclosure of which is incorporated by reference herein.

FIELD OF THE INVENTION

This invention relates to semiconductor devices and more specifically to double sided semiconductor devices and to packages therefor.

BACKGROUND OF THE INVENTION

Semiconductor devices are commonly formed in one surface of a semiconductor wafer, such as a silicon wafer, and, after the fabrication process is complete, the individual die are separated (singlulated) by sawing or the like. It is possible to fabricate both top and bottom surfaces of the wafer to form double sided die which may have MOSgated device diffusions and electrodes on both surfaces with a centrally disposed common drain region common to both devices. Alternatively, other semiconductor patterns such as diodes could be formed in one or both surfaces of the wafer, again with the center of the wafer forming a common region to both devices.

The cost of producing the double sided device die is about 50% higher than the conventional single active surface die, but produces twice as many devices and reduces the "foot print" or mounting area on a circuit board to which the die are to be mounted.

Since the double sided devices using MOSFETs, for example, have epitaxially deposited layers ("epi") on both die or wafer surfaces which receive the device junctions, it is difficult to make contact to the central common drain, for example, an $N^+$ or $P^+$ substrate which is sandwiched between the top and bottom epi layers.

For low voltage power devices a diffusion from the top surface may be used to access the central drain region. This, however, will reduce the top device source region area and reduce the source area metallization which adversely increases the device on resistance $R_{DSON}$. For higher voltage power devices, with a thicker epi layer, the diffusion time will be very long. For example, to access the $N^+$ substrate of a 600 volt power FET from the top, it would be necessary to drive a phosphorus doping species 60 microns. Again this would take up a large portion of the source region area, so a large area die would be needed to keep $R_{DSON}$ sufficiently low.

BRIEF DESCRIPTION OF THE INVENTION

In accordance with the invention, a double sided die is provided with one or more similar or diverse die diffusion patterns in both top and bottom die surfaces with a central die region common to both top and bottom die patterns and contact to the common central region is made at the edge of the die.

Thus the invention enables cost effective double-sided silicon or other semiconductor technology for discrete power devices, particularly high voltage (in excess of about 100 volts), which devices may be power FETs, Schottky and diffused diodes, IGBTs, bi-directional FETs and efficient, low foot-print multi-chip assemblies.

BRIEF DESCRIPTION OF THE DRAWINGS

FIG. 6A shows the wafer of FIG. 5A after the application of source, gate and drain bumps, with the drain bumps applied to edges of the die.

FIG. 6B is a cross-section of FIG. 6A taken across section line 6B-6B in FIG. 6A.

FIG. 7A shows the wafer of FIG. 6A after the wafer is sawed (diced or singulated) into separate die.

FIG. 7B is a cross-section of FIG. 7A taken across section line 7B-7B in FIG. 7A.

FIG. 8 shows a single die of FIG. 7B ready for assembly.

FIG. 9 is a perspective view of the die of FIG. 8.

DETAILED DESCRIPTION OF THE DRAWINGS

Figure 1:
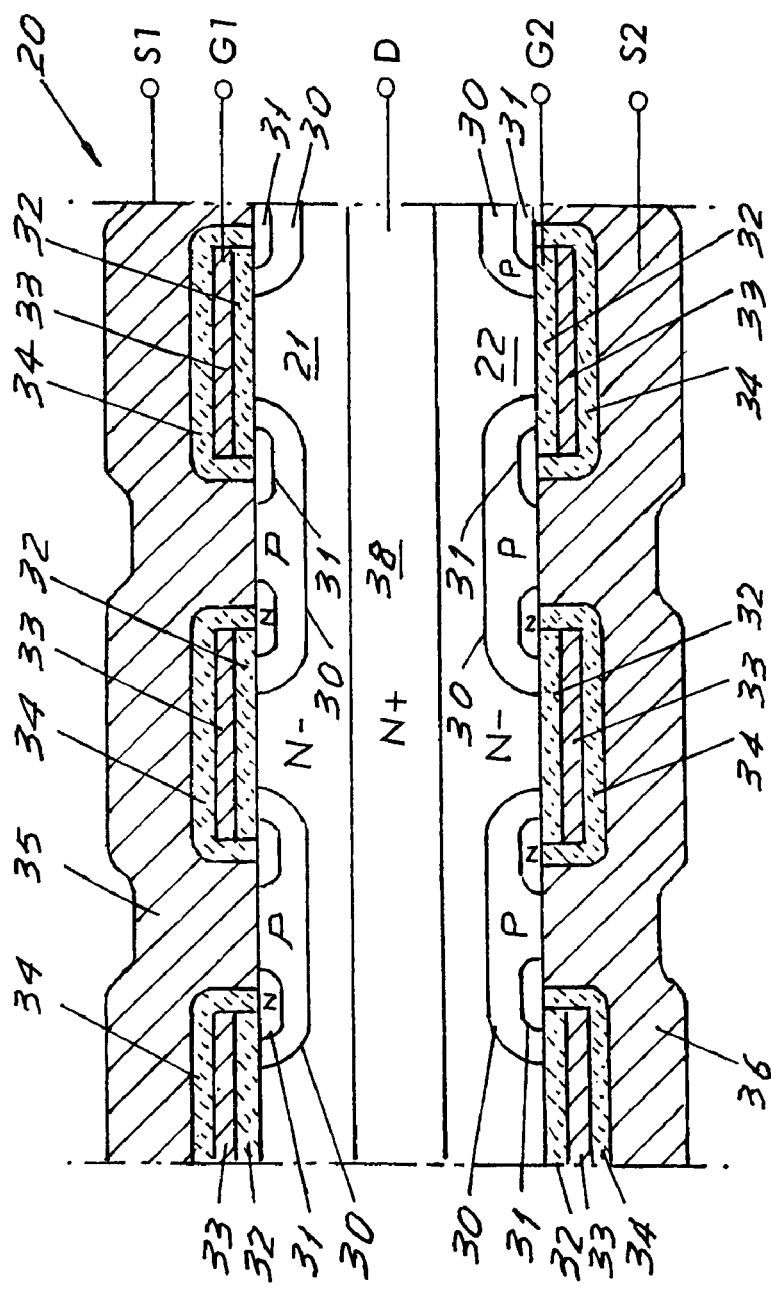
FIG. 1 is a cross-section of a small portion of a wafer having planar vertical conduction MOSFET patterns formed in both the top and bottom surfaces of the wafer.
Figure 2:
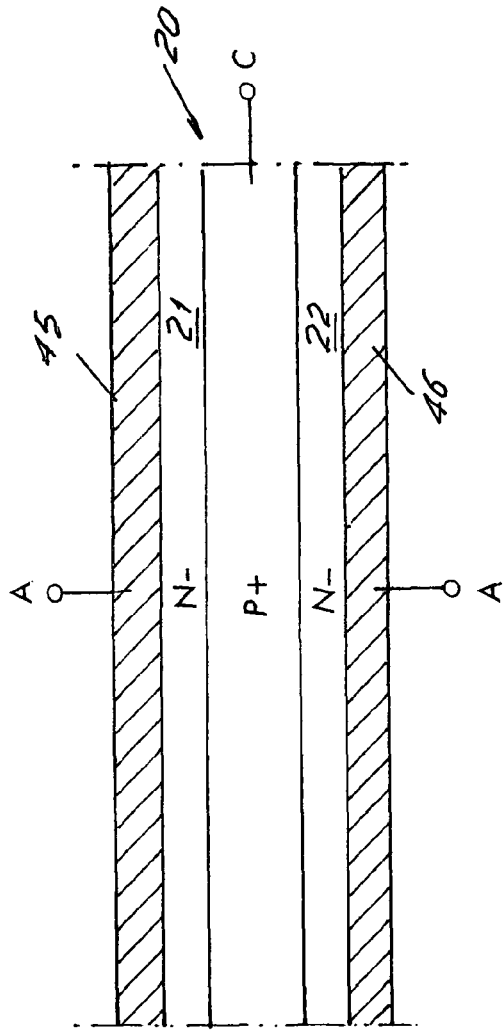
FIG. 2 is a cross-section of a small portion of a wafer having diode patterns formed in both the top and bottom surfaces of the wafer.
Figure 3:
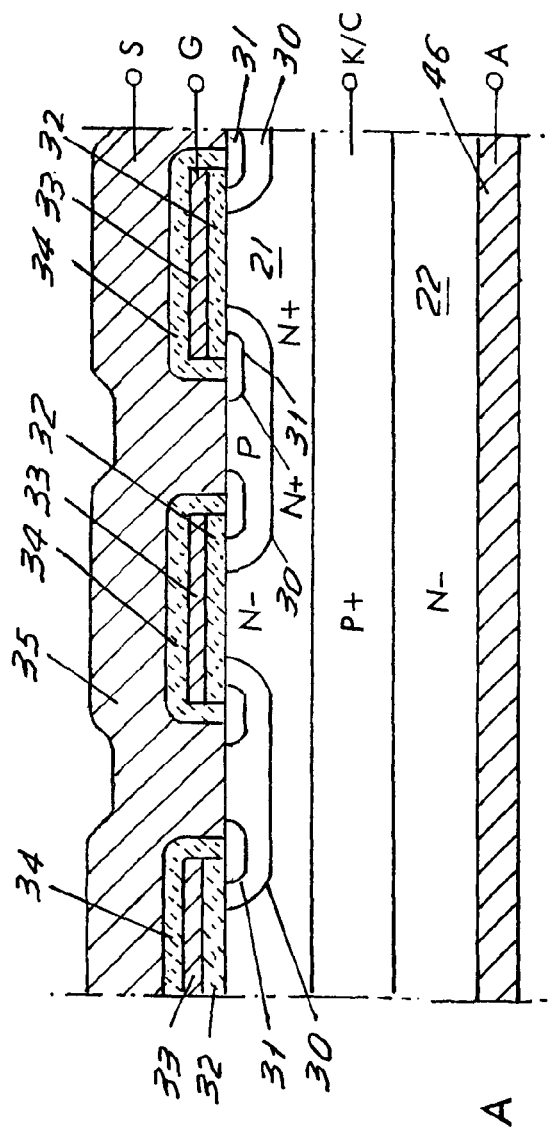
FIG. 3 is a cross-section of a small portion of a wafer having a planar vertical conduction MOSFET pattern in its top surface and a diode formed in the bottom surface of the wafer.

Referring to FIGS. 1, 2 and 3, there is shown a cross-section of a small portion of a semiconductor wafer 20. Wafer 20 may be monocrystalline silicon, although other materials could be used such as silicon carbide, gallium nitride and the like.

The wafer of FIG. 1 is shown as having the $N^+$ conductivity type and has $N^-$ junction-receiving epi layers 21, 22 on its top and bottom surfaces respectively. The wafer 20 could also be $P^+$, as in FIGS. 2 and 3, with top and bottom epi layers 21 and 22 of N⁻ epi or P type epi if desired, depending on the type device to be formed in the top and bottom wafer surfaces. Trench type topologies could be used, but FIGS. 1, 2 and 3 are planar topologies.

The thickness of wafer 20 and the N and P concentrations and the thickness of epi layers 21 and 22 are chosen as desired for the desired voltage and current characteristics of the device to be formed.

Figure 1A:
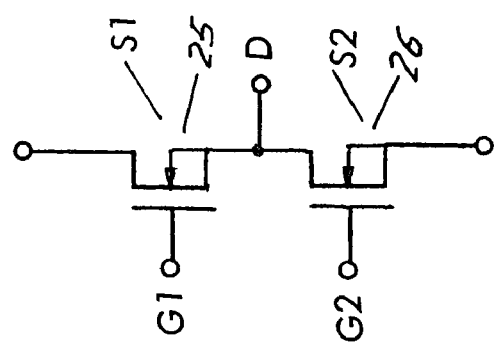
FIG. 1a is a circuit diagram of a die singulated from the wafer of FIG. 1.

In FIG. 1, vertical conduction MOSFETs 25 and 26 (FIG. 1*a*) are formed in the top and bottom epi layers 20 and 21 respectively.

Thus, P diffusions 30 form the device bases or channel regions and N⁺ sources 31 are formed in each of bases 30. An SiO2 gate dielectric 32 is conventionally formed over each invertible channel region at the wafer surfaces between the edge of the source regions 31 and their respective base. A conductive polysilicon gate 33 overlies the dielectric gate 32. A suitable dielectric insulation layer 34 (such as TEOS) then overlies the gates 33, and the top and bottom surfaces receive source electrodes 35 and 36 respectively, which are insulated from gates 32. Source electrodes 35 and 36 contact each source region 31 and each base 30 in the usual manner.

N⁻ epi regions 21 and 22 act as drift regions for MOSFETs 25 and 26 respectively which are connected to the single N⁺ central drain 38 which is common to both devices. As will be seen, a common drain contact will be made to an edge of common N⁺ drain 38 for each MOSFET 25 and 26. Gate contacts G1 and G2 (not shown in FIG. 1) are connected to gates 32 on the top and bottom surfaces of the wafer.

Figure 2A:
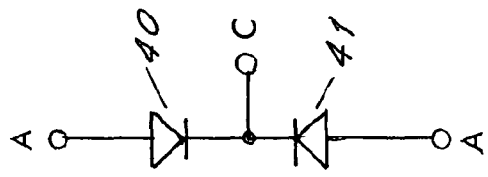
FIG. 2a is a circuit diagram of a die singulated from the wafer of FIG. 2.

As pointed out previously, the invention can also apply to devices other than MOSgated devices. Thus, FIG. 2 shows the wafer 20 (as a P⁺ wafer) but receiving anode contacts 45 and 46 on epi regions 21 and 22 to define two diodes as shown in FIG. 2*a*.

Figure 3A:
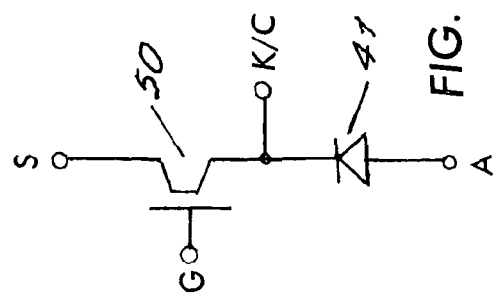
FIG. 3a shows a circuit diagram of a die singulated from the wafer of FIG. 3.

Similarly, and as shown in FIGS. 3 and 3A, the top of wafer can receive an IGBT such as IGBT 50 in its top surface having P⁺ drain (or collector) contact, and a diode 41 in its bottom surface.

After the double sided device is completed, it is subsequently processed to make the central common region, such as the central N⁺ region 38 in FIG. 1 or the equivalent P⁺ region of FIGS. 2 and 3, available for an edge contact which avoids reducing the source areas of each die singulated from the wafer.

Figure 4A:
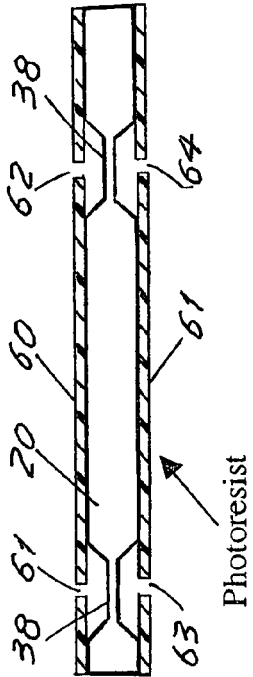
FIG. 4A is a top view of a portion of a wafer which is coated with a patterned etch resistant photoresist and is partially etched from both surfaces to define discrete die elements.
Figure 4B:
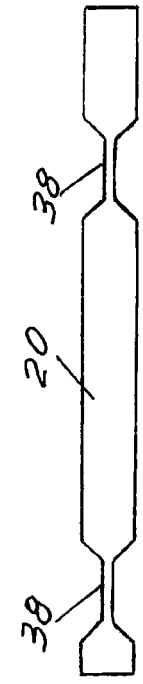
FIG. 4B is a cross-section of FIG. 4A taken across section line 4B-4B in FIG. 4A.

Thus, as shown in FIGS. 4A and 4B, patterned photoresists 60 and 61 are formed on the top and bottom surfaces of wafer 20 and windows 62, 63, 64, 65 are formed in photoresist layers 60, 61. The wafer is then etched as shown in FIG. 4B to define region 38 at least one edge of each die location. Where the wafer 20 has a thickness of 600 microns, the depth of each etch may be about 200 microns deep from each of the bottom and top surfaces.

Figure 5A:
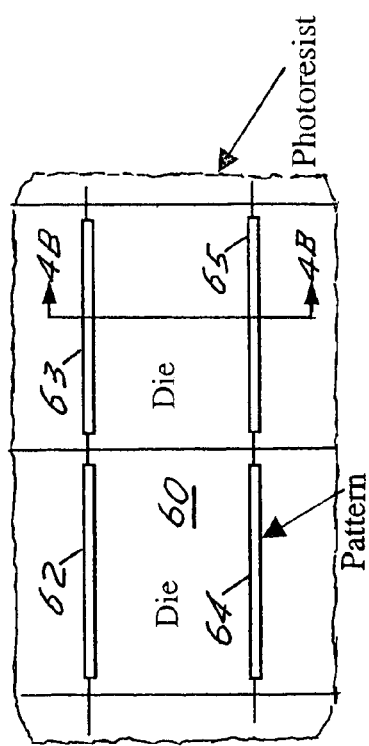
FIG. 5A shows the wafer of FIG. 4A after the photoresist is stripped and showing "bumping" areas for application of source and gate bumps.
Figure 5B:
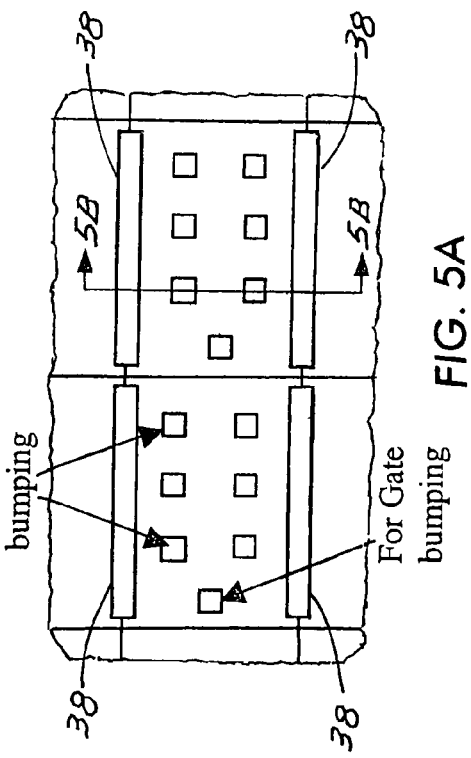
FIG. 5B is a cross-section of FIG. 5A taken across section line 5B-5B in FIG. 5A.

Thereafter, and as shown in FIGS. 5A and 5B, the photoresist layers 60 and 61 are stripped and the wafer surfaces are prepared for source bumps and gate bumps connected to the source and gate metallizations.

As next shown in FIGS. 6A and 6B, gate bumps 70 and 71 are applied to top surface (and to the bottom surface, not shown) and source bumps 72, 73, 74, 75, 76 and 77 are applied to both wafer surfaces. At the same time, drain bumps 80, 81 are applied to central drain region at the edges of each die.

The wafer 20 is then sawn or singulated as shown in FIGS. 7A and 7B, slicing through the etched areas and drain bumps 80, 81 with saw cuts 82, 83. A perpendicular saw cut defines the perpendicular edges for each die.

The final die will have the appearance shown in FIGS. 8 and 9.

Figure 10:
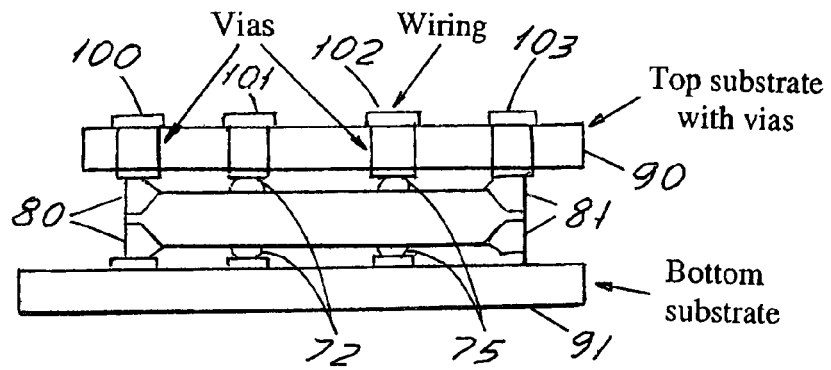
FIG. 10 is a cross-section of an assembly or package containing the die of FIGS. 8 and 9.

The die of FIGS. 8 and 9, or the die formed from the wafers of FIGS. 2 and 3 are capable of being supported in numerous advantageous low foot prints. FIG. 10 shows one such package having a top insulation substrate 90 and a bottom substrate 91 which can be ceramic or FR4 boards or the like, and may have patterned conductive layers which are connected as desired to the various contact bumps of the die. The lower bumps 70 (not shown) 72, 75 and 80 are connected to suitable metallizing on substrate 91. Top substrate 90 is provided with vias 100, 101, 102, 103 connected to top device bumps 80, 72, 75 and 81 respectively and make the nodes of the device available at the device top for wiring and interconnect convenience as a stacked flip chip assembly.

Figure 11:
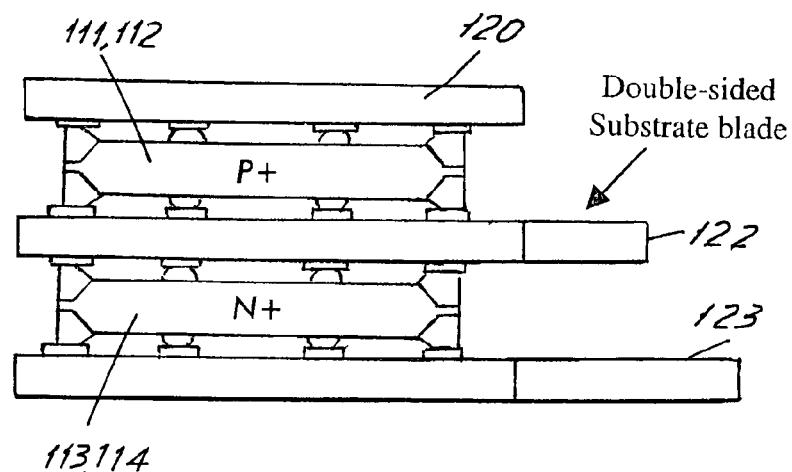
FIG. 11 shows a stack of two interconnected die of the type of FIGS. 1, 8 and 9 which may be P channel and N channel MOSFETs respectively, interconnected on a central substrate blade.
Figure 11A:
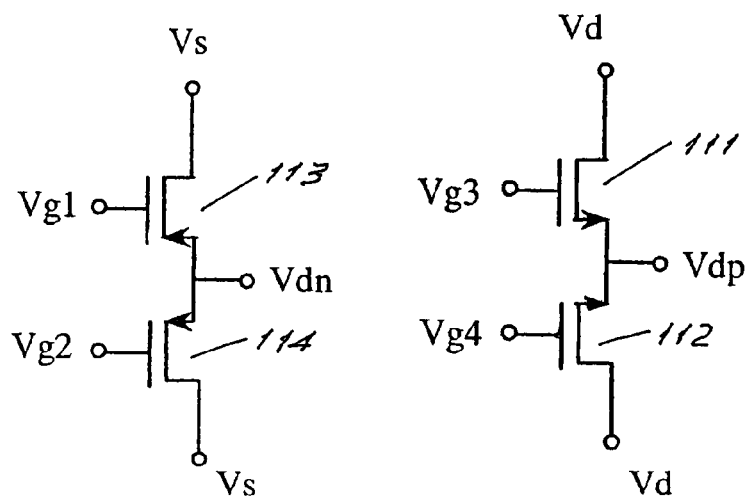
FIG. 11a shows a circuit diagram of the structure of FIGS. 11, 12 and 13.
Figure 12:
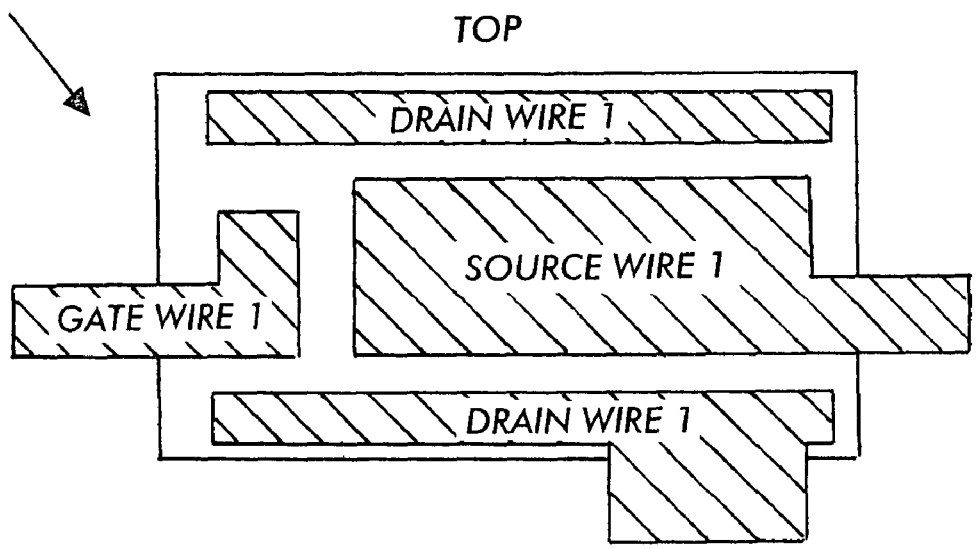
FIGS. 12 and 13 show the conduction patterns on the top and bottom surfaces respectively of the central substrate blade of FIG. 11.
Figure 13:
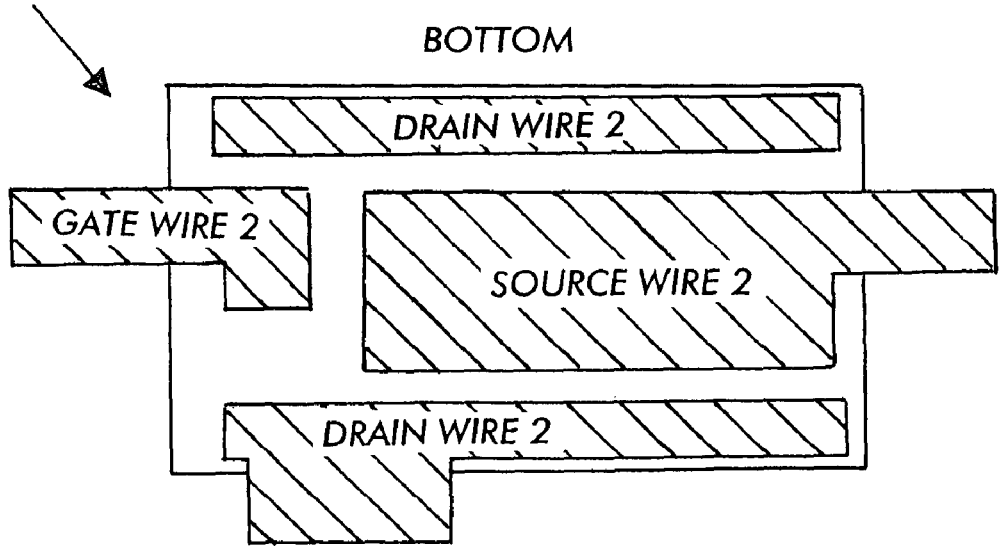
Figure 14:
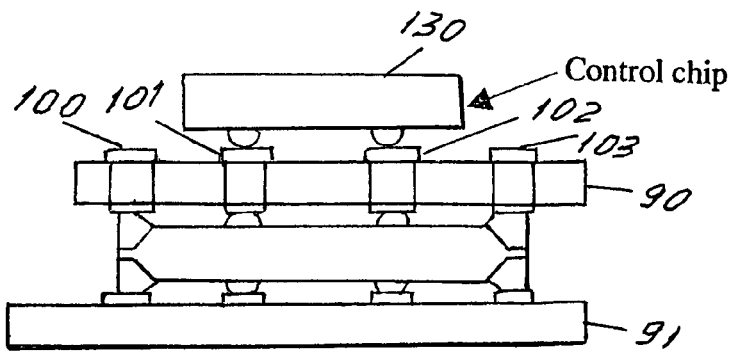
FIG. 14 shows the assembly of FIG. 10 with a control integrated circuit (IC) chip on the top of the assembly.

It is also possible to stack two or more two sided die to achieve better device as performance such as reduced $R_{DSON}$, and reduced interconnect capacitance but within a single footprint as shown in FIG. 11, for example. FIG. 11*a* shows two double sided die, one with a pair of P channel FETs 111, 112 (FIG. 14) and the other a pair of N channel FETs 113, 114 (FIG. 14). The top device 111/112 receives a top support substrate 120 and the bottom device 113/114 receives a bottom support substrate 121. The top of a central double sided substrate blade 122 receives the bottom contact bumps of P channel device 111/112 and the bottom of blade 122 receives the top contact bumps of N channel device 113/114. The contact pattern on top of central blade 122 is shown in FIG. 12, and the contact pattern on the bottom of blade 122 is shown in FIG. 13. Note that the gate, source and drain electrodes protrude out of the periphery of the device as shown in FIGS. 12 and 13 to serve as connection pins.

FIG. 14 is another example of a novel package in which the two sided die of FIG. 10 is further adapted with a control IC 130 which is connected (not shown) to the gate and source bumps of the device.

Figure 15:
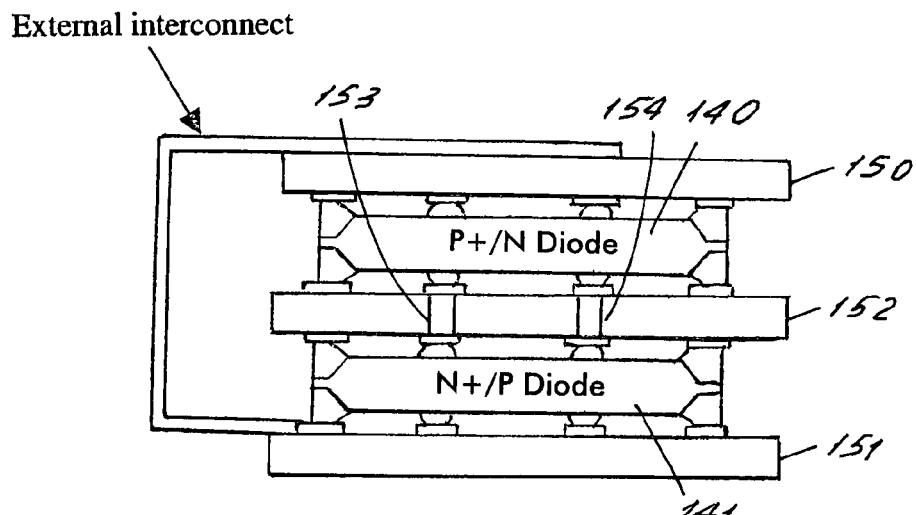
FIG. 15 shows an assembly of diodes employing die as in FIG. 2 which defines a full wafer bridge.
Figure 16:
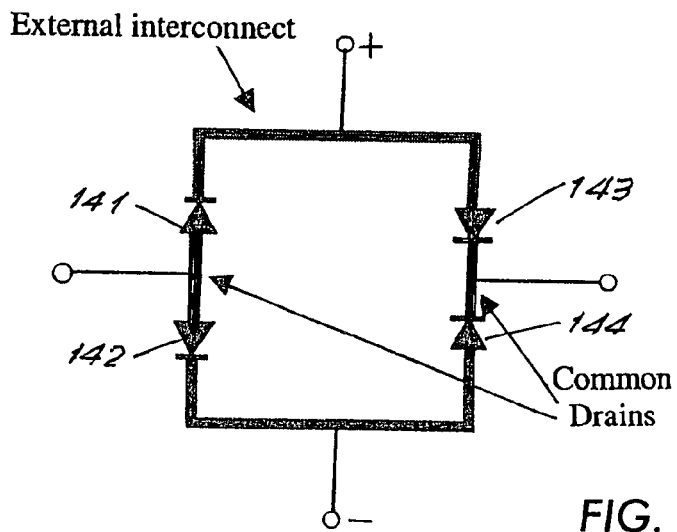
FIG. 16 shows the circuit of the assembly of FIG. 15.

FIG. 15 shows another package for two double sided diode die of the type made from the wafer of FIG. 2. Thus, a double sided die 140 of two P⁺/N diodes 141, 142 (FIG. 16) is stacked with a double sided die 141 consisting of two N⁺/P diodes 143, 144 (FIG. 16). Top and bottom substrates 150, 151 in FIG. 15 are connected to the top and bottom contact bumps of devices 140 and 141 respectively; and the central substrate blade 152 has vias 153, 154 to connect the bottoms of diodes 142 and 144; and an external interconnect connects the tops of diodes 141 and 143.

Note that all assemblies can be filled with insulation compound after assembly.

Although the present invention has been described in relation to particular embodiments thereof, many other variations and modifications and other uses will become apparent to those skilled in the art. It is preferred, therefore, that the present invention be limited not by the specific disclosure herein.

What is claimed is:

1. A semiconductor die having a first opposing surface and a second opposing surface, and an edge having a recess formed therein, said semiconductor die comprising:
   a first semiconductor device formed in a first semiconductor body, said first semiconductor body including said first opposing surface and at least one contact on said first opposing surface;
   a second semiconductor device formed in a second semiconductor body, said second semiconductor body including said second opposing surface and at least one contact on said opposing surface;

a common laterally extending terminal semiconductor region embedded in an interior of said die between and in direct contact with said first and second semiconductor bodies; and a common conductive terminal disposed inside said recess at said edge and directly connected to said common laterally extending terminal semiconductor region inside said recess to serve as a common terminal for said first and said second semiconductor devices.

2. The semiconductor die of claim 1, wherein at least one of said first and second semiconductor devices is a MOSgated device and wherein said common terminal region is a drain region.

3. The semiconductor die of claim 1, wherein said first and second semiconductor devices are MOSgated devices and wherein said common terminal region is the drain region for each of said MOSgated devices.

4. The semiconductor die of claim 1, wherein said die is monocrystalline silicon having a thickness of greater than about 400 microns.

5. The semiconductor die of claim 4, wherein said top and bottom said die have epitaxially deposited silicon layers each having a thicknesses of less than about 200 microns; and wherein said first and second semiconductor devices are defined at least in part by diffusions into said epitaxially deposited silicon layers.

6. The semiconductor die of claim 5, wherein at least one of said first and second semiconductor devices is a MOSgated device and wherein said common terminal region is a drain region.

7. The semiconductor die of claim 1, wherein said first and second semiconductor devices are MOSgated devices and wherein said common terminal region is the drain region for each of said MOSgated devices.

8. A double-sided semiconductor die including a first side, an opposing side, an interior region, and an edge with a recess, said double-sided semiconductor die to be used for packaging a plurality of semiconductor devices, wherein:

said first side contains a first contact and a first semiconductor device of said plurality of semiconductor devices;

said opposing side contains a second contact and a second semiconductor device of said plurality of semiconductor devices;

said interior region is in direct electrical contact with said first side and said opposing side, wherein said interior region further comprises a common conductive terminal at said recess.

9. The double-sided semiconductor die of claim 8, wherein at least one semiconductor device of said first and second semiconductor devices is a MOSgated device.

10. The double-sided semiconductor die of claim 8, wherein said common conductive terminal corresponds to a drain region of at least one semiconductor device of said first and second semiconductor devices.

11. The double-sided semiconductor die of claim 8, at least one semiconductor device of said first and second semiconductor devices is a diode.

12. The double-sided semiconductor die of claim 8, wherein said common conductive terminal corresponds to a cathode of at least one semiconductor device of said first and second semiconductor devices.

13. The double-sided semiconductor die of claim 8, at least one semiconductor device of said first and second semiconductor devices is an insulated gate bipolar transistor.

14. The double-sided semiconductor die of claim 8, wherein said common conductive terminal corresponds to a collector of at least one semiconductor device of said first and second semiconductor devices.

15. The double-sided semiconductor die of claim 8, wherein:

said first side is adapted to make electrical contact with at least one via on a top insulating substrate;

said opposing side is in electrical contact with a metallizing body on a bottom substrate.

16. The double-sided semiconductor die of claim 15, wherein said semiconductor die is used as part of a flip-chip assembly.

17. The double-sided semiconductor die of claim 15, wherein said first insulating layer is in electrical contact with a control integrated circuit ("IC").

18. The double-sided semiconductor die of claim 8, wherein:

said first side is adapted to make electrical contact with at least one via on a top insulating substrate;

said opposing side is in electrical contact with a central substrate blade.

* * * * *